(12) United States Patent
Panzer

(10) Patent No.: US 7,157,982 B2
(45) Date of Patent: Jan. 2, 2007

(54) WIEN-ROBINSON OSCILLATOR WITH STABILIZED OUTPUT VOLTAGE

(75) Inventor: Karlheinz Panzer, Schwebheim (DE)

(73) Assignee: Bosch Rexroth AG, Lohr/Main (DE)

( * ) Notice: Subject to any disclaimer, the term of this patent is extended or adjusted under 35 U.S.C. 154(b) by 0 days.

(21) Appl. No.: 10/507,573

(22) PCT Filed: Jun. 18, 2003

(86) PCT No.: PCT/EP03/06427

§ 371 (c)(1),
(2), (4) Date: Sep. 10, 2004

(87) PCT Pub. No.: WO2004/004113

PCT Pub. Date: Jan. 8, 2004

(65) Prior Publication Data

US 2005/0122181 A1   Jun. 9, 2005

(30) Foreign Application Priority Data

Jun. 27, 2002   (DE) .............................. 102 28 694

(51) Int. Cl.
*H03B 5/20* (2006.01)
(52) U.S. Cl. .................... 331/141; 331/135; 331/140
(58) Field of Classification Search ................ 331/141
See application file for complete search history.

(56) References Cited

U.S. PATENT DOCUMENTS

| | | | | |
|---|---|---|---|---|
| 3,212,026 A | 10/1965 | Julie | .......................... | 331/141 |
| 3,417,349 A | 12/1968 | Schneider | .................... | 331/141 |
| 3,891,946 A | 6/1975 | Aker | ...................... | 331/108 D |
| 5,277,495 A * | 1/1994 | Forehand | .................... | 374/183 |

FOREIGN PATENT DOCUMENTS

| DE | 2945999 | 6/1980 |
|---|---|---|
| DE | 3711671 | 10/1988 |

OTHER PUBLICATIONS

Wittlinger H et al: "Operationsverstarker in Bimos-E-Technologie" Elektronik, Franzis Verlag GMBH Munchen DE vol. 38, No. 10, May 12, 1989 pp. 91-97.
Tietze Schenk "Halbleiter-Schaltungstechnik", Springer Verlag, 8th revised edition, 1986, pp. 454-458.

* cited by examiner

*Primary Examiner*—Joseph Chang
(74) *Attorney, Agent, or Firm*—Martin A. Farber

(57) ABSTRACT

In a Wien-Robinson oscillator, a negative feedback path and a positive feedback path are arranged between the output of an operational amplifier and a reference ground potential. The negative feedback path contains two resistors which are connected in series and whose common circuit point is connected to the inverting input of the operational amplifier. The positive feedback path is formed from two RC elements which are connected in series and whose common circuit point is connected to the non-inverting input of the operational amplifier. If the aim is to keep the amplitude of the output voltage from the oscillator constant, additional measures are required, which increase the circuitry complexity. In order to stabilize the output voltage from the oscillator with little complexity, a third resistor is arranged between the output of the operational amplifier and that end of the positive feedback path which faces away from the reference ground potential. The common circuit point between the positive feedback path and the third resistor is connected via diodes which are connected in opposites senses, to a positive auxiliary voltage and to a negative auxiliary voltage. The magnitudes of the two auxiliary voltages are of the same magnitude, and the diodes are connected such that they limit the voltage at the common circuit point. Oscillators such as these are used, inter alia, for feeding inductive or capacitive movement sensors.

10 Claims, 1 Drawing Sheet

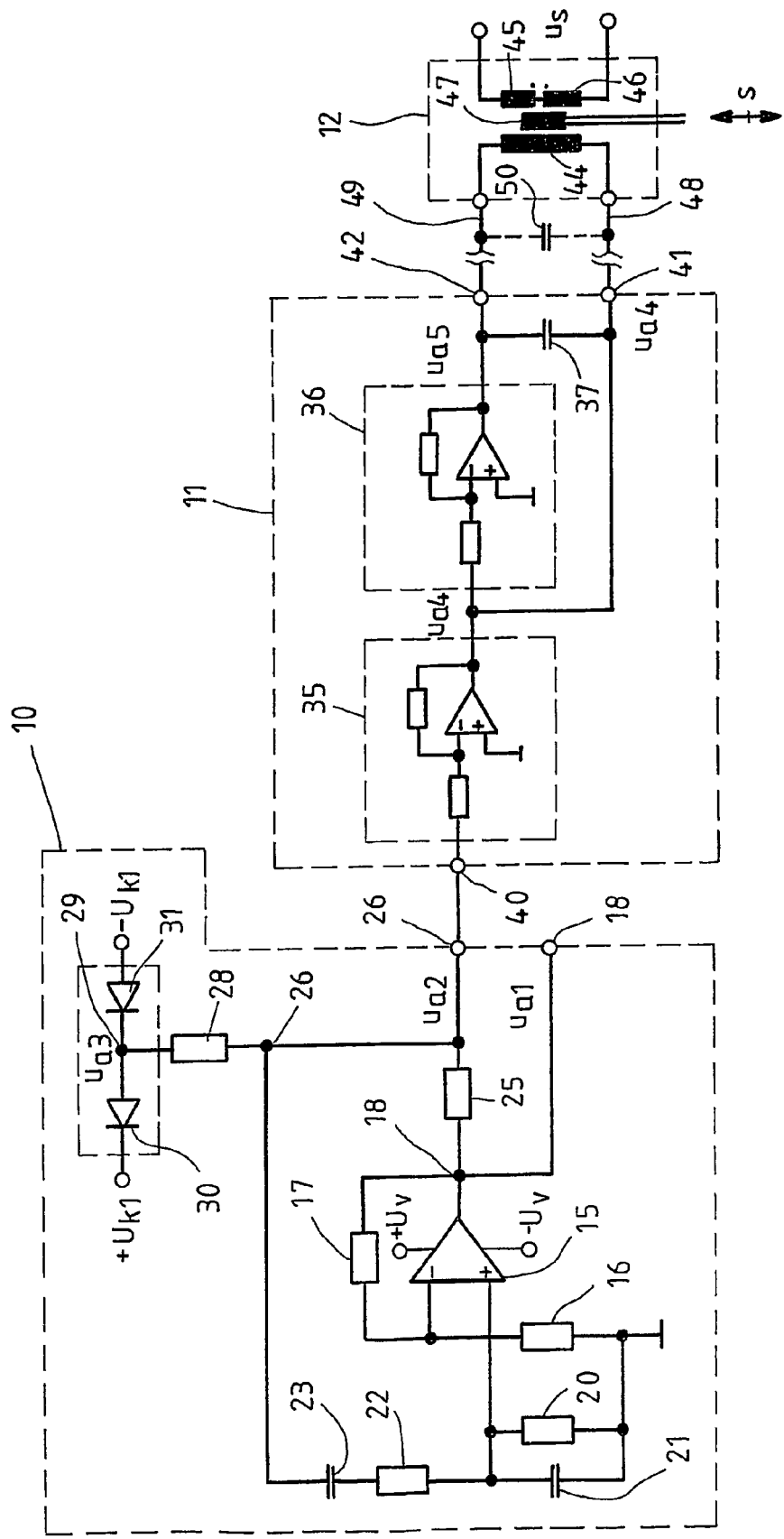

WIEN-ROBINSON OSCILLATOR WITH STABILIZED OUTPUT VOLTAGE

FIELD AND BACKGROUND OF THE INVENTION

The invention relates to a Wien-Robinson oscillator having an operational amplifier, which is provided with a negative feedback path and with a positive feedback path.

A Wien-Robinson oscillator such as this is known in particular from the text book by Tietze-Schenk "Halbleiter-Schaltungstechnik" [Semiconductor circuit technology], Springer Verlag, 8th revised edition, 1986, pages 454 to 458. The frequency of a Wien-Robinson oscillator is governed by RC elements, that is to say networks formed from resistors and capacitors. Oscillators such as these are preferably used in the audio frequency range, since in this frequency range, the inductances and capacitances of LC oscillators are inconveniently large. In the case of a Wien-Robinson oscillator, a Wien-Robinson bridge circuit, such as that illustrated in FIG. 15.26 on page 455, is used as a feedback network and as an element that governs the frequency. The fundamental circuit of an oscillator such as this is illustrated in FIG. 15.27 on page 456. A negative feedback path and a positive feedback path are arranged between the output of the operational amplifier and a reference ground potential. The negative feedback path essentially comprises two resistors, whose common circuit point is connected to the inverting input of the operational amplifier. The positive feedback path comprises two RC elements which are connected in series and whose common circuit point is connected to the non-inverting input of the operational amplifier. The RC element which is arranged between the non-inverting input of the operational amplifier and the reference ground potential comprises a resistor and a capacitor connected in parallel. The other RC element, which is arranged between the non-inverting input and the output of the operational amplifier, comprises a further resistor and a further capacitor connected in series. In order to satisfy the oscillation condition of the Wien-Robinson oscillator, the resistor which is arranged in the negative feedback path between the inverting input of the operational amplifier and the reference ground potential has half the resistance of the resistor which is arranged between the inverting input and the output of the operational amplifier. Furthermore, the resistors and the capacitors in the two RC elements of the positive feedback path are each of the same magnitude. In order to stabilize the output voltage of the oscillator, the resistor which is arranged between the reference ground potential and the inverting input of the operational amplifier in FIG. 15.27 is in the form of a fixed resistor and a controllable resistor connected in series. The controllable resistor is formed by the drain/source path in a generally symmetrical field-effect transistor, whose drain connection is connected to the reference ground potential. In the case of a symmetrical field-effect transistor, the source connection may alternatively be connected to the reference ground potential, instead of the drain connection. The controllable resistor in the form of a field-effect transistor allows the resistance ratio in the negative feedback path to be varied so as to satisfy the condition for the output voltage from the oscillator to have a constant amplitude. For this purpose, the output voltage from the oscillator is rectified, and the rectified voltage is supplied via a matching circuit to the gate connection of the field-effect transistor, as a control voltage. The amplitude level of the output voltage from the oscillator in this circuit depends on the data of the field-effect transistor. The stability of the output voltage from the oscillator can be improved—as is illustrated in FIG. 15.28 on page 458—by intermediate amplification of the gate voltage. Although the stated measures improve the stability of the output voltage from the oscillator, on the other hand, however, they also increase the circuitry complexity that is required for the oscillator. A further disadvantage of the described circuit arrangement is that the amplitude control system is highly sensitive to EMC interference. As normal, the letters "EMC" stand for "electromagnetic compatibility" in this case.

SUMMARY OF THE INVENTION

The invention is based on the object of providing a Wien-Robinson oscillator of the type mentioned initially, in which the amplitude of the output voltage is kept constant by simple means.

This object is achieved by the features set forth in the claims. The additional resistor between that end of the positive feedback path which faces away from the reference ground potential and the output of the operational amplifier acts in conjunction with two auxiliary voltages, which are of equal magnitude but of opposite polarity, and which are connected to the common circuit point between the positive feedback path and the additional resistor via a respective diode, in order to stabilize the amplitude of the output voltage by changing the ratio between the positive feedback and the negative feedback.

Advantageous developments of the invention, as described hereinafter, include a resistor connected to a common circuit point which improves the signal quality, in particular the sinusoidal shape of the output voltage from the oscillator, and reduces the distortion factor. One of the two connections of the resistor which is arranged in series with the output of the operational amplifier can be used as the output of the oscillator. If that connection of the resistor which faces away from the output of the operational amplifier is used as the output of the oscillator the amplitude of the output Voltage with an essentially constant load is more stable than the output of the operational amplifier is used as the output of the oscillator. Furthermore, the third harmonic of the output voltage from the oscillator is suppressed. A signal which is stable despite changes in the load is produced if the output of the operational amplifier is used as the output of the oscillator. The output signal from the operational amplifier is highly suitable, in particular, as the auxiliary signal for controlling the switching processes. The use of a driver connected downstream from the output of the oscillator avoids reactions on the oscillator when the load is changing or in response to external disturbances, which are injected via a cable leading to the load. Loading the output of the driver with a resonant circuit that is formed from an inductive impedance and a capacitance connected in parallel, suppresses radio-frequency interference and reduces the current drawn and the power lost in the oscillator. This is the case to a particular extent when the natural frequency of the resonant circuit is designed, such that it is equal to the oscillation frequency of the oscillator. The oscillator is particularly suitable for feeding inductive or capacitive measured value sensors, in particular movement sensors.

BRIEF DESCRIPTION OF THE DRAWINGS

The invention will be explained in more detail in the following text together with its further details, on the basis of an exemplary embodiment which is illustrated in the drawing.

DETAILED DESCRIPTION OF THE PREFERRED EMBODIMENT

The single figure shows the circuit diagram of a Wien-Robinson oscillator 10 according to the invention, in conjunction with an amplifier arrangement 11, which is designed in accordance with the dependent claims, and a schematically illustrated inductive movement sensor 12.

The Wien-Robinson oscillator 10 has an operational amplifier 15 which is provided with a negative feedback path and a positive feedback path. Two voltages $+U_v$ and $-U_v$ with opposite mathematical signs, but whose magnitudes are the same, are used as supply voltages for the operational amplifier 15. The negative feedback path is formed from two resistors 16 and 17 connected in series. Their common circuit point is connected to the inverting input of the operational amplifier 15. The other connection of the resistor 16 is connected to the reference ground potential, while the other connection of the resistor 17 is connected to the output of the operational amplifier 15. The output of the operational amplifier 15 is annotated with the reference symbol 18, and its output voltage is annotated $u_{a1}$. The positive feedback path is formed from two RC elements connected in series, with one RC element comprising a resistor 20 and a capacitor 21 connected in parallel, and the other RC element comprising a further resistor 22 and a further capacitor 23 connected in series. The RC element which is formed from the resistor 20 and the capacitor 21 is arranged between the non-inverting of the operational amplifier 15 and the reference ground potential. The RC element which is formed from the resistor 22 and the capacitor 23 is arranged between the non-inverting input of the operational amplifier 15 and the output 18 of the operational amplifier 15, with a further resistor 25 being arranged between the capacitor 23 and the output 18. The common circuit point between the capacitor 23 and the resistor 25 is annotated with the reference symbol 26. The voltage at the circuit point 26 is annotated $u_{a2}$. A resistor 28 is connected to the circuit point 26, and its other connection is annotated with the reference symbol 29. The voltage which is produced at the circuit point 29 is annotated $u_{a3}$. The circuit point 29 is connected via a first diode 30 to a constant positive auxiliary voltage $+U_{k1}$, and via a second diode 31, connected in the opposite sense, to a constant negative auxiliary voltage $-U_{k1}$. The auxiliary voltages $+U_{k1}$ and $-U_{k1}$ have equal magnitudes, but are chosen to be less than the magnitudes of the voltages $+U_v$ and $-U_v$.

If, first of all, one imagines that the resistor 25 has been bridged and that the connection between the circuit point 26 and the resistor 28 has at the same time been disconnected, then this results in a known Wien-Robinson oscillator. The oscillation condition for an oscillator such as this is satisfied in a known manner if the resistor 16 which is arranged in the negative feedback path between the inverting input of the operational amplifier 15 and the reference ground potential has half the resistance of the resistor 17 which is arranged between the inverting input and the output 18 of the operational amplifier 25 and if, furthermore, the resistors 20 and 22 as well as the capacitors 21 and 23 in the two RC elements of the positive feedback path are respectively of the same magnitude. In this case, the negative feedback and the positive feedback are of equal magnitude, and this results in an essentially sinusoidal voltage $u_{a1}$ at the output 18, whose frequency, which is annotated $f_{10}$, is governed in a known manner by the product of the resistor 20 and the capacitor 21. As already stated in the introduction, extensive additional measures have until now been necessary in order to keep the amplitude of the oscillation of an oscillator such as this constant.

In order to keep the amplitude of the output voltage of the Wien-Robinson oscillator 10 constant, the resistor 25 is, according to the invention, and as already described above, inserted between the circuit points 18 and 26. In this exemplary embodiment, the voltage $u_{a2}$ of the circuit point 26 is used as the output voltage from the Wien-Robinson oscillator 10. However, as an alternative to this, it is also possible to use the output voltage from the operational amplifier 15, that is to say the voltage $u_{a1}$ at the circuit point 18, as the output voltage from the Wien-Robinson oscillator 10. In this exemplary embodiment, the voltage $u_{a2}$ is used as the output voltage from the Wien-Robinson oscillator 10 since, if the load is essentially constant, this is more stable than the output voltage $u_{a1}$ from the operational amplifier 15. The voltage $u_{a1}$ is, in contrast, highly suitable as an auxiliary signal for controlling switching processes, although this is neither illustrated nor described here.

The positive feedback path of the Wien-Robinson oscillator 10 according to the invention is configured such that the positive feedback is stronger than the negative feedback, as long as the diodes 30 and 31 are reverse-biased. In this operating state, the voltage $u_{a3}$ is equal to the voltage $u_{a2}$, since no current flows via the resistor 28. The amplitudes of the voltages $u_{a1}$ and $u_{a2}$ increase when the positive feedback is dominant until the magnitude of the voltage $u_{a2}$, and thus of the voltage $u_{a3}$ as well, becomes larger than the respective auxiliary voltage $+U_{k1}$ and $-U_{k1}$ plus the forward-biased voltage of the respective diode 30 or the diode 31. If the voltage $u_{a2}$ is greater than the auxiliary voltage $+U_{k1}$ plus the forward-biased voltage of the diode 30, the diode 30 is forward-biased, and current flows from the circuit point 26 via the resistor 28 and the diode 30. In the process, the voltage $u_{a2}$ which governs the positive feedback is limited to a value which is greater than the voltage $u_{a3}$ by the voltage drop across the resistor 28. In this operating state, the voltage $u_{a3}$ is equal to the sum of the auxiliary voltage $+U_{k1}$ and the forward-biased voltage of the diode 30, which is annotated $U_{d30}$. The current which flows via the resistor 28 in this operating state produces an additional voltage drop across the resistor 25. This leads to a further increase in the voltage $u_{a1}$ which governs the negative feedback. Thus, in this operating state, the negative feedback has a stronger effect than the positive feedback. This leads to oscillations decaying until the voltage $u_{a2}$ has fallen sufficiently that the diode 30 becomes reverse-biased again, and the positive feedback is once again stronger than the negative feedback. The positive feedback in the Wien-Robinson oscillator 10 thus alternately becomes stronger or weaker than the negative feedback. This results in a virtually sinusoidal oscillation, with a constant amplitude, when averaged over time. The resistor 25 has a resistance such that the operational amplifier 15 operates in the linear range. The smaller the resistance of the resistor 28, the more strongly the sinusoidal shape of the voltage $u_{a2}$ is used as the output voltage of the Wien-Robinson oscillator 10 is chopped when the limiting produced by the diode 30 and the auxiliary voltage $+U_{k1}$ or by the diode 31 and the auxiliary voltage $-U_{k1}$ comes into effect.

The amplifier arrangement 11 has a driver 35, a reversing amplifier 36 connected downstream from it, and a capacitor 37. That input of the amplifier arrangement 11 which is annotated with the reference symbol 40 is connected to the output 26 of the Wien-Robinson oscillator 10. The driver 35 prevents reactions resulting from changes in a load that is connected to the Wien-Robinson oscillator 10. The amplifier arrangement 11 has two outputs 41 and 42. The output 41 is at the same time the output of the driver 35, while the output 42 is at the same time the output of the reversing amplifier 36. The output voltage from the driver 35 and the output voltage from the reversing amplifier 36 are respectively annotated $u_{a4}$ and $u_{a5}$. In this exemplary embodiment, the driver 35 is in the form of an inverting amplifier. However, in principle, it is also possible for the driver to be a non-inverting amplifier. The reversing amplifier 36 is in the form of an inverting amplifier with the gain factor $V=-1$. This results in the voltage $u_{a5}$ being produced such that it is equal to $-u_{a4}$.

The inductive movement sensor 12 has a primary coil 44 as well as two secondary coils 45 and 46, which are wound in opposite senses. The primary coil 44 is supplied by the antiphase voltages $u_{a4}$ and $u_{a5}$. A moving core 47 is arranged between the primary coil 44 and the secondary coils 45 and 46, and varies the coupling between the primary coil 44 and the secondary coils 45 and 46 depending on its deflection. The movement sensor 12 converts a movement s in a manner known per se to a voltage which is in this case annotated $u_s$, which further in circuit arrangements which are not illustrated here. The outputs 41 and 42 of the amplifier arrangement 22 are connected via lines 48 and 49, respectively, to the primary coil 44 of the movement sensor 12. Depending on the respective application, the lines 48 and 49 have different lengths. There is a risk of interference signals being injected via the lines 48 and 49. The driver 35 prevents interference signals from having any reactive effect on the output of the Wien-Robinson oscillator 10. Together with the primary coil 44 in the movement sensor 12, the capacitor 37 forms an LC resonant circuit. The capacitor 37 has a capacitance such that the natural frequency $f_{0*}$ of the LC resonant circuit 37, 44 is equal to the oscillation frequency $f_0$ of the Wien-Robinson oscillator 10. This results in radio-frequency interference being suppressed, and reduces the power losses in the Wien-Robinson oscillator 10. The lines 48 and 49 form a capacitor 50, which is connected in parallel with the capacitor 37 and the primary coil 44. In the figure, the capacitor 50 is represented by dashed lines since, in this case, it is not a physical capacitor, but represents a capacitive component of the lines 48 and 49. If the capacitance of the lines 48 and 49 is not negligibly small in comparison to the capacitor 37, the capacitance of the capacitor 50 must additionally be taken into account in the capacitance of the capacitor 37, that is to say a correspondingly smaller capacitor 37 should be chosen.

Instead of the inductive movement sensor 12 as illustrated in the figure and having a primary coil and two secondary coils, it is also possible to use an inductor as an inductive movement sensor, with a center tap and a moving core which controls the coupling of the inductor. In this case, the voltage which is tapped off at the center tap is a measure of the deflection of the moving core.

I claim:

1. A Wien-Robinson oscillator (10)
   having an operational amplifier (15),
   having a negative feedback path which is formed from two resistors connected in series and in which the first resistor (16) is arranged between the reference ground potential and the inverting input of the operational amplifier (15), and the second resistor (17) connects directly to the output (18) of the operational amplifier (15) and is arranged between the output (18) of the operational amplifier (15) and its inverting input,
   having a positive feedback path, which is formed from two RC elements connected in series, in which the first RC element (20, 21) is arranged between the reference ground potential and the non-inverting input of the operational amplifier (15), and in which the second RC element (22, 23) is connected at one end to the non-inverting input of the operational amplifier (15) and at the other end is connected via a common circuit point (26) to a third resistor (25), wherein the common circuit point is connected via the third resistor (25) to the output (18) of the operational amplifier (15), with the first RC element being formed from a first capacitor (21) and a fourth resistor (20) connected in parallel, and with the second RC element being formed from a second capacitor (23) and a fifth resistor (22) connected in series,
   having a first diode (30) via which the common circuit point (26) is connected to a constant positive auxiliary voltage (+Uk1), and having a second diode (31), via which the common circuit point (26) is connected to a constant negative auxiliary voltage (−Uk1), with the magnitudes of the two auxiliary voltages (+U k1, −Uk1) being the same, and the diodes (30, 31) being connected such that they limit the voltage (Ua2) at the common circuit point (26).

2. The Wien-Robinson oscillator as claimed in claim 1, wherein the output (18) of the operational amplifier (15) serves as the output of the oscillator.

3. The Wien-Robinson oscillator as claimed in claim 1, wherein the common circuit point (26) between the second RC element (22, 23) and the third resistor (25) serves as the output of the oscillator.

4. A Wien-Robinson oscillator (10)
   having an operational amplifier (15),
   having a negative feedback path which is formed from two resistors connected in series and in which the first resistor (16) is arranged between the reference ground potential and the inverting input of the operational amplifier (15), and the second resistor (17) connects directly to the output (18) of the operational amplifier (15) and is arranged between the output (18) of the operational amplifier (15) and its inverting input,
   having a positive feedback path, which is formed from two RC elements connected in series, in which the first RC element (20, 21) is arranged between the reference ground potential and the non-inverting input of the operational amplifier (15), and in which the second RC element (22, 23) is connected at one end to the non-inverting input of the operational amplifier (15) and at the other end via a third resistor (25) to the output (18) of the operational amplifier (15), with the first RC element being formed from a first capacitor (21) and a fourth resistor (20) connected in parallel, and with the second RC element being formed from a second capacitor (23) and a fifth resistor (22) connected in series,
   having a first diode (30) via which the common circuit point (26) between the second RC element (22, 23) and the third resistor (25) is connected to a constant positive auxiliary voltage (+Uk1), and having a second diode (31), via which the common circuit point (26) is connected to a constant negative auxiliary voltage (−Uk1), with the magnitudes of the two auxiliary voltages (+U k1, −Uk1) being the same, and the diodes (30, 31) being connected such that they limit the voltage (Ua2) at the common circuit point (26), and wherein a sixth resistor (28) is arranged between the common circuit point (26) between the second RC element (22, 23) and the third resistor (25), and the diodes (30, 31).

5. The Wien-Robinson oscillator as claimed in claim 4, wherein the common circuit point (26) between the second RC element (22, 23) and the third resistor (25) serves as the output of the oscillator.

6. The Wien-Robinson oscillator as claimed in claim 5, wherein the output (26) of the oscillator is followed by a driver (35).

7. The Wien-Robinson oscillator as claimed in claim 6, wherein the driver (35) is followed by an inductive impedance (44) and a third capacitor (37) connected in parallel.

8. The Wien-Robinson oscillator as claimed in claim 7, wherein the natural frequency (fO*) of the resonant circuit which is formed from the inductive impedance (44) and the third capacitor (37) is designed such that it is equal to the natural frequency (fO) of the Wien-Robinson oscillator (10).

9. Use of a Wien-Robinson oscillator as claimed in claim 7 for feeding an inductive movement sensor (12) which contains one or more coils (44, 45, 46), with the inductive impedance being formed by at least one coil (44) of the movement sensor (12).

10. Use of a Wien-Robinson oscillator as claimed in claim 8 for feeding an inductive movement sensor (12) which contains one or more coils (44, 45, 46), with the inductive impedance being formed by at least one coil (44) of the movement sensor (12).

* * * * *